(12) United States Patent
Lin

(10) Patent No.: US 10,382,004 B2
(45) Date of Patent: Aug. 13, 2019

(54) MATCHING NETWORK CIRCUIT, AND ASSOCIATED APPARATUS WITH SHARED MATCHING NETWORK CIRCUIT

(71) Applicant: MEDIATEK INC., Hsin-Chu (TW)

(72) Inventor: Chien-Cheng Lin, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 437 days.

(21) Appl. No.: 15/201,501

(22) Filed: Jul. 3, 2016

(65) Prior Publication Data

US 2017/0117870 A1   Apr. 27, 2017

Related U.S. Application Data

(60) Provisional application No. 62/244,711, filed on Oct. 21, 2015.

(51) Int. Cl.
*H03F 1/02* (2006.01)
*H03F 1/56* (2006.01)
(Continued)

(52) U.S. Cl.
CPC ............. *H03H 7/38* (2013.01); *H03F 1/0277* (2013.01); *H03F 1/565* (2013.01); *H03F 3/19* (2013.01); *H03F 3/245* (2013.01); *H03F 3/72* (2013.01); *H04B 1/0458* (2013.01); *H03F 2200/06* (2013.01); *H03F 2200/222* (2013.01); *H03F 2200/294* (2013.01); *H03F 2200/429* (2013.01);
(Continued)

(58) Field of Classification Search
CPC .. H03H 7/38; H03H 2210/025; H03F 1/0277; H03F 1/565; H03F 3/19; H03F 3/72; H03F 2200/06; H03F 2200/222; H03F 2200/294; H03F 2200/429; H03F 2200/507; H03F 2203/7209; H03F 2203/7227; H04B 1/0458
See application file for complete search history.

(56) References Cited

U.S. PATENT DOCUMENTS 5,969,582 A   10/1999   Boesch
6,188,877 B1   2/2001   Boesch
(Continued)

FOREIGN PATENT DOCUMENTS

CN   104242829 A   12/2014

*Primary Examiner* — Robert J Pascal
*Assistant Examiner* — Kimberly E Glenn
(74) *Attorney, Agent, or Firm* — Winston Hsu

(57) ABSTRACT

A matching network circuit and an associated apparatus are provided. The matching network circuit includes a matching unit coupled between a common path port and a first path port of the matching network circuit, and an impedance unit coupled between the common path port and a second path port of the matching network circuit. The common path port is utilized for connecting the matching network circuit to a common path, the first path port is utilized for connecting the matching network circuit to a first device on a first path, and the second path port is utilized for connecting the matching network circuit to a second device on a second path. The matching unit is arranged for performing impedance matching between the common path port and the first path port, and the impedance unit is arranged for performing impedance matching between the common path port and the second path port.

18 Claims, 4 Drawing Sheets

(51) Int. Cl.
    *H03F 3/19*    (2006.01)
    *H03F 3/24*    (2006.01)
    *H03F 3/72*    (2006.01)
    *H03H 7/38*    (2006.01)
    *H04B 1/04*    (2006.01)

(52) U.S. Cl.
    CPC ............. *H03F 2200/507* (2013.01); *H03F 2203/7209* (2013.01); *H03F 2203/7227* (2013.01); *H03H 2210/025* (2013.01)

(56)         References Cited

U.S. PATENT DOCUMENTS

| | | |
|---|---|---|
| 8,417,201 B1 | 4/2013 | Schooley |
| 9,031,517 B2 | 5/2015 | Jerng |
| 2006/0030282 A1 | 2/2006 | Aggarwal |
| 2008/0136516 A1 | 6/2008 | Afsahi |
| 2012/0105147 A1* | 5/2012 | Harris ................ H03F 1/56 |
| | | 330/57 |
| 2013/0234799 A1 | 9/2013 | Gudem |
| 2014/0179241 A1 | 6/2014 | Aggarwal |
| 2015/0214920 A1* | 7/2015 | Kuo ................ H03H 7/468 |
| | | 333/126 |

* cited by examiner

MATCHING NETWORK CIRCUIT, AND ASSOCIATED APPARATUS WITH SHARED MATCHING NETWORK CIRCUIT

CROSS REFERENCE TO RELATED APPLICATIONS

This application claims the benefit of U.S. Provisional Application No. 62/244,711, which was filed on Oct. 21, 2015, and is included herein by reference.

BACKGROUND

The present invention relates to impedance matching, and more particularly, to a matching network circuit, and an associated apparatus.

According to the related art, conventional impedance matching networks may be utilized for performing impedance matching in a conventional portable electronic device, to resolve some transmission issues. However, further problems such as some side effects may occur. For example, each of the conventional impedance matching networks typically occupies a large portion of the chip area. In another example, in a situation where two of the conventional impedance matching networks are positioned on two signal paths that are related to each other, re-designing the two of the conventional impedance matching networks may be required since one conventional impedance matching network of them may affect the other conventional impedance matching network. Thus, a novel architecture is required to improve impedance matching control of electronic devices, in order to guarantee the overall performance of the electronic devices with fewer side effects.

SUMMARY

It is an objective of the claimed invention to provide a matching network circuit, and an associated apparatus, in order to solve the above-mentioned problems.

It is another objective of the claimed invention to provide a matching network circuit, and an associated apparatus, in order to reduce the chip area of a semiconductor chip.

It is another objective of the claimed invention to provide a matching network circuit, and an associated apparatus, in order to keep high stability of an electronic device in each of various situations.

According to at least one preferred embodiment, a matching network circuit is provided, where the matching network circuit may comprise a matching unit that is coupled between a common path port and a first path port of the matching network circuit, and may further comprise an impedance unit that is coupled between the common path port and a second path port of the matching network circuit. In addition, the common path port is utilized for connecting the matching network circuit to a common path, the first path port is utilized for connecting the matching network circuit to a first device on a first path, and the second path port is utilized for connecting the matching network circuit to a second device on a second path, wherein signals on the first and the second paths have a same transmission direction (e.g. an input direction, or an output direction) with respect to a node between the common path and the first and the second paths. Additionally, the matching unit may be arranged for performing impedance matching between the common path port and the first path port, and the impedance unit may be arranged for performing impedance matching between the common path port and the second path port with aid of the matching unit. In some embodiments, there is not any switch between the common path port and the impedance unit, and there is not any switch between the second path port and the impedance unit, where there is not any switch between the second path port and the second device. In some embodiments, there is not any switch between the common path port and the matching unit, and there is not any switch between the first path port and the matching unit, where there is not any switch between the first path port and the first device. For example, both of the first path port and the second path port are input ports. In another example, both of the first path port and the second path port are output ports.

According to at least one preferred embodiment, an associated apparatus is provided, where the apparatus may comprise a first device on a first path, a second device on a second path, and a matching network circuit that is coupled between the first device and the second device. For example, the matching network circuit may comprise a matching unit that is coupled between a common path port and a first path port of the matching network circuit, and may further comprise an impedance unit that is coupled between the common path port and a second path port of the matching network circuit. In addition, the common path port is utilized for connecting the matching network circuit to a common path, the first path port is utilized for connecting the matching network circuit to the first device on the first path, and the second path port is utilized for connecting the matching network circuit to the second device on the second path, wherein signals on the first and the second paths have a same transmission direction (e.g. an input direction, or an output direction) with respect to a node between the common path and the first and the second paths. Additionally, the matching unit may be arranged for performing impedance matching between the common path port and the first path port, and the impedance unit may be arranged for performing impedance matching between the common path port and the second path port with aid of the matching unit, where the first device and the second device share the matching network circuit. In some embodiments, there is not any switch between the common path port and the impedance unit, and there is not any switch between the second path port and the impedance unit, where there is not any switch between the second path port and the second device. In some embodiments, there is not any switch between the common path port and the matching unit, and there is not any switch between the first path port and the matching unit, where there is not any switch between the first path port and the first device. For example, both of the first path port and the second path port are input ports. In another example, both of the first path port and the second path port are output ports.

It is an advantage of the present invention that the present invention circuit and apparatus can keep high stability of the electronic device in each of various situations, and the related art problems will no longer be an issue. In addition, the present invention circuit and apparatus can reduce the chip area of a semiconductor chip of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
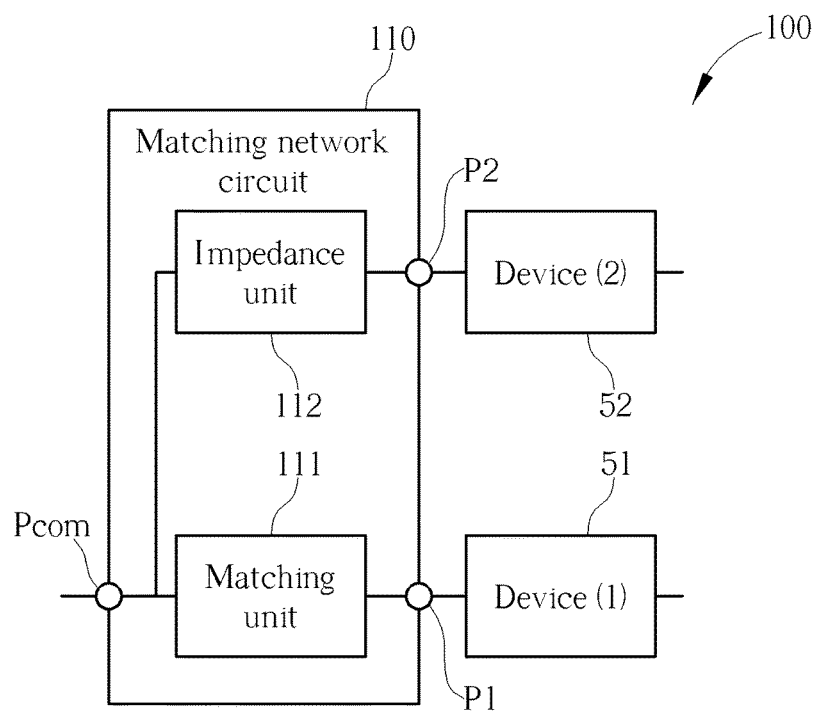
FIG. 1 is a diagram of an apparatus with a shared matching network circuit according to an embodiment of the present invention.

FIG. 1 is a diagram of an apparatus 100 with a shared matching network circuit according to an embodiment of the present invention, where the apparatus 100 may comprise at least one portion (e.g. a portion or all) of an electronic device. For example, the apparatus 100 may comprise a portion of the electronic device mentioned above, and more particularly, can be at least one hardware circuit such as at least one integrated circuit (IC) within the electronic device and associated circuits thereof. In another example, the apparatus 100 can be the whole of the electronic device mentioned above. In another example, the apparatus 100 may comprise a system comprising the electronic device mentioned above (e.g. a wireless communications system comprising the electronic device). Examples of the electronic device may include, but not limited to, a mobile phone (e.g. a multifunctional mobile phone), a tablet, and a personal computer such as a laptop computer or a desktop computer.

As shown in FIG. 1, the apparatus 100 may comprise a first device 51 (labeled "Device (1)" in FIG. 1, for better comprehension) on a first path within the electronic device, a second device 52 (labeled "Device (2)" in FIG. 1, for better comprehension) on a second path within the electronic device, and a matching network circuit 110 that is coupled between the first device 51 and the second device 52, where all of the first device 51, the second device 52, and the matching network circuit 110 are positioned in the electronic device. For example, the matching network circuit 110 may comprise a matching unit 111 that is coupled between a common path port Pcom and a first path port P1 of the matching network circuit 110, and may further comprise an impedance unit 112 that is coupled between the common path port Pcom and a second path port P2 of the matching network circuit 110, where the matching unit 111 may be positioned on the first path, and the impedance unit 112 may be positioned on the second path. In addition, the common path port Pcom is utilized for connecting the matching network circuit 110 to a common path, the first path port P1 is utilized for connecting the matching network circuit 110 to the first device 51 on the first path, and the second path port P2 is utilized for connecting the matching network circuit 110 to the second device 52 on the second path, where signals on the first and the second paths have the same transmission direction (e.g. an input direction, or an output direction) with respect to a node between the common path and the first and the second paths. Additionally, the matching unit 111 may be arranged for performing impedance matching between the common path port Pcom and the first path port P1, and the impedance unit 112 may be arranged for performing impedance matching between the common path port Pcom and the second path port P2 with aid of the matching unit 111. Please note that the first device 51 on the first path and the second device 52 on the second path share the matching network circuit 110. Therefore, only one matching unit (e.g. the matching unit 111) is needed. This is for illustrative purposes only, and is not meant to be a limitation of the present invention. According to some embodiments, the combination of the matching unit 111 and the impedance unit 112 can be utilized for performing impedance matching for the second device 52 on the second path, and the matching unit 111 can be utilized for performing impedance matching for the first device 51 on the first path, where the existence of the impedance unit 112 does not hinder the impedance matching that the matching unit 111 performs for the first device 51 on the first path. In some embodiments, whether the impedance unit 112 exists or not does not significantly affect the impedance matching that the matching unit 111 performs for the first device 51 on the first path. In some embodiments, regarding the impedance matching that the matching unit 111 performs for the first device 51 on the first path, there is no significant difference between installing the impedance unit 112 and not installing the impedance unit 112.

According to this embodiment, there is not any switch between the common path port Pcom and the matching unit 111, and there is not any switch between the first path port P1 and the matching unit 111, where there is not any switch between the first path port P1 and the first device 51. In addition, there is not any switch between the common path port Pcom and the impedance unit 112, and there is not any switch between the second path port P2 and the impedance unit 112, where there is not any switch between the second path port P2 and the second device 52. For example, each of the first device 51 and the second device 52 can be an amplifier (e.g. a power amplifier, or a low noise amplifier (LNA)), or can be one of other types of circuits such as other devices or components.

According to some embodiments, the impedance of the impedance unit 112 is higher than that of the matching unit 111 so that the matching unit 111 dominates the overall impedance of the matching network circuit 110 (e.g., on the first path). For example, the impedance of the matching unit 111 and the impedance of the impedance unit 112 may differ by one or more orders, so the impedance of the impedance unit 112 may be one or more orders of magnitude greater than that of the matching unit 111. More particularly, the impedance of the impedance unit 112 may be multiple orders of magnitude greater than that of the matching unit 111. In some embodiments, the impedance of the matching unit 111 may be approximately 50 Ohm (Ω), while the impedance of the impedance unit 112 may be much greater than that of the matching unit 111.

According to some embodiments, the matching unit 111 may comprise a capacitor bank. For example, the capacitor bank may be tunable. More particularly, the capacitor bank may be used for fine tuning the overall impedance of the matching network circuit 110. According to some embodiments, the impedance unit 112 may comprise a passive component (e.g. a capacitor, an inductor, or a high-impedance device). For example, the impedance unit 112 may be the passive component, and there is not any other component within the impedance unit 112. This is for illustrative purposes only, and is not meant to be a limitation of the present invention. According to some embodiments of the present invention, the impedance unit 112 may comprise one or more passive components. Examples of the aforementioned one or more passive components may include, but not limited to, capacitors, inductors, and high-impedance devices.

In some embodiments, the signals on the first and the second paths may have the same transmission direction with respect to the node between the common path and the first and the second paths, such as the aforementioned output direction, and the signals on the first and the second paths are output signals from this node. Thus, both of the first path port P1 and the second path port P2 may be output ports of the matching network circuit 110. In this situation, the common path port Pcom is an input port Pin of the matching network circuit 110. For example, the matching network circuit 110 may receive an input signal at the input port Pin, and the matching network circuit 110 may be coupled to an input terminal of the first device 51 through the first path port P1, and may be coupled to an input terminal of the second device 52 through the second path port P2. More particularly, the matching network circuit 110 may filter the input signal to generate a first intermediate signal on the first path and to generate a second intermediate signal on the second path, where the input terminal of the first device 51 may input the first intermediate signal into the first device 51, and the input terminal of the second device 52 may input the second intermediate signal into the second device 52. For example, the first device 51, the second device 52, and the matching network circuit 110 may be positioned in a transmitter within the electronic device, and each of the first device 51 and the second device 52 can be the power amplifier mentioned above.

In some embodiments, the signals on the first and the second paths may have the same transmission direction with respect to the node between the common path and the first and the second paths, such as the aforementioned input direction, and the signals on the first and the second paths are input signals into this node. Thus, both of the first path port P1 and the second path port P2 may be input ports of the matching network circuit 110. In this situation, the common path port Pcom is an output port Pout of the matching network circuit 110. For example, the matching network circuit 110 may output an output signal at the output port Pout, and the matching network circuit 110 may be coupled to an output terminal of the first device 51 through the first path port P1, and may be coupled to an output terminal of the second device 52 through the second path port P2. More particularly, the matching network circuit 110 may filter a first intermediate signal on the first path and a second intermediate signal on the second path to generate the output signal, where the output terminal of the first device 51 may output the first intermediate signal from the first device 51, and the output terminal of the second device 52 may output the second intermediate signal from the second device 52. For example, the first device 51, the second device 52, and the matching network circuit 110 may be positioned in a receiver within the electronic device, and each of the first device 51 and the second device 52 can be the LNA mentioned above.

Figure 2:
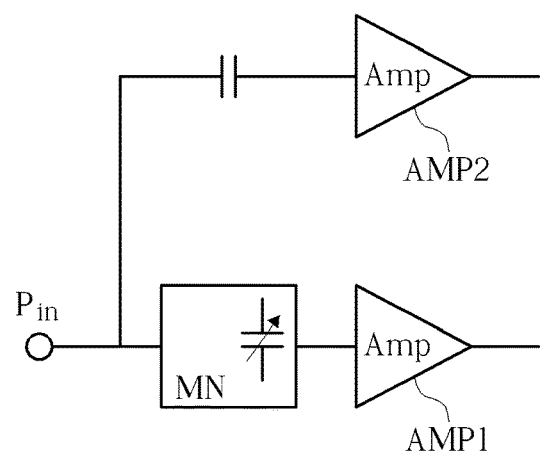
FIG. 2 illustrates some implementation details of the apparatus shown in FIG. 1 according to an embodiment of the present invention.

FIG. 2 illustrates some implementation details of the apparatus 100 shown in FIG. 1 according to an embodiment of the present invention, where the input port $P_{in}$ can be taken as an example of the input port Pin mentioned above. For example, the first device 51 and the second device 52 can be implemented with two amplifiers AMP1 and AMP2 (each of which is labeled "Amp" in FIG. 2, for brevity), respectively, and the two amplifiers AMP1 and AMP2 can be power amplifiers positioned in a transmitter such as that mentioned above, and can be single-ended amplifiers. In addition, the matching network (MN) can be taken as an example of the matching unit 111 shown in FIG. 1, and may comprise the aforementioned capacitor bank that may be tunable. Additionally, the capacitor electrically connected between the input port $P_{in}$ and the amplifier AMP2 can be taken as an example of the aforementioned passive component within the impedance unit 112. Based on the architecture shown in FIG. 2, the first path port P1 of this embodiment comprises a single output terminal electrically connected to the input terminal of the amplifier AMP1, and the second path port P2 of this embodiment comprises a single output terminal electrically connected to the input terminal of the amplifier AMP2. For brevity, similar descriptions for this embodiment are not repeated in detail here.

In the embodiment shown in FIG. 2, the capacitor electrically connected between the input port $P_{in}$ and the amplifier AMP2 can be taken as an example of the aforementioned passive component within the impedance unit 112. This is for illustrative purposes only, and is not meant to be a limitation of the present invention. According to some embodiments of the present invention, the passive component may vary. For example, this capacitor may be replaced by an inductor. In another example, this capacitor may be replaced by a high-impedance device.

Figure 3:
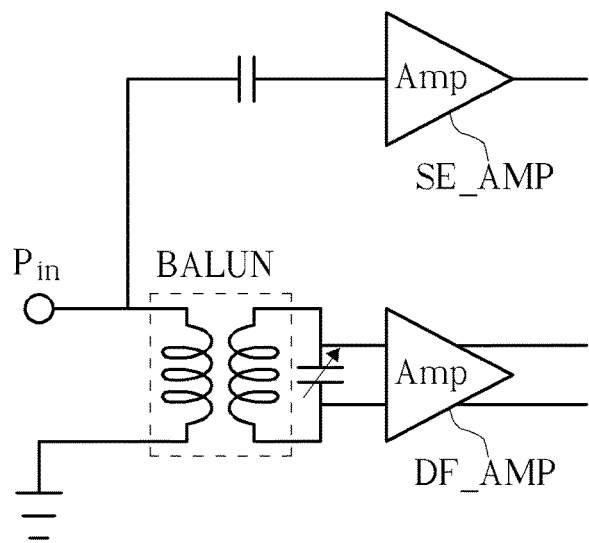
FIG. 3 illustrates some implementation details of the apparatus shown in FIG. 1 according to another embodiment of the present invention.

FIG. 3 illustrates some implementation details of the apparatus 100 shown in FIG. 1 according to another embodiment of the present invention, where the input port $P_{in}$ can be taken as an example of the input port Pin mentioned above. For example, the first device 51 and the second device 52 can be implemented with a differential amplifier DF_AMP and a single-ended amplifier SE_AMP (each of which is labeled "Amp" in FIG. 3, for brevity), respectively, and the differential amplifier DF_AMP and the single-ended amplifier SE_AMP can be power amplifiers positioned in a transmitter such as that mentioned above. In addition, the matching unit 111 of this embodiment may comprise a balun and a tunable capacitor bank (e.g. the aforementioned capacitor bank that may be tunable). Additionally, the capacitor electrically connected between the input port $P_{in}$ and the single-ended amplifier SE_AMP can be taken as an example of the aforementioned passive component within the impedance unit 112. Based on the architecture shown in FIG. 3, the first path port P1 of this embodiment comprises two differential output terminals electrically connected to the two differential input terminals of the differential amplifier DF_AMP, and the second path port P2 of this embodiment comprises a single output terminal electrically connected to the input terminal of the single-ended amplifier SE_AMP. For brevity, similar descriptions for this embodiment are not repeated in detail here.

In the embodiment shown in FIG. 3, the capacitor electrically connected between the input port $P_{in}$ and the single-ended amplifier SE_AMP can be taken as an example of the aforementioned passive component within the impedance unit 112. This is for illustrative purposes only, and is not meant to be a limitation of the present invention. According to some embodiments of the present invention, the passive component may vary. For example, this capacitor may be replaced by an inductor. In another example, this capacitor may be replaced by a high-impedance device.

According to some embodiments, the input impedance of the second device 52 (e.g. the amplifier AMP2, or the single-ended amplifier SE_AMP) should be much higher than 50 Ohm, and the input matching unit 111 has matched the first device 51 (e.g. the amplifier AMP1, or the differential amplifier DF_AMP) to the impedance of 50 Ohm. After the second device 52 is connected through the impedance unit 112 to the matching unit 111, the impedance at the common path port Pcom (e.g. the input port Pin) is still close to 50 Ohm. For example, in a situation where the common path port Pcom is the input port Pin of the matching network circuit 110, the matching unit 111 can be regarded as the input matching unit for the first device 51. In this situation, after the second device 52 is connected through the impedance unit 112 to the input matching unit for the first device 51, such as the matching unit 111, the input impedance at the input port Pin is still close to 50 Ohm.

According to some embodiments, the impedance unit 112 can be regarded as the input or output matching for the second device 52 (e.g. the amplifier AMP2, or the single-ended amplifier SE_AMP). For example, the impedance unit 112 can be reduced to one series capacitor (e.g. for direct current (DC) blocking) after the second device 52 is coupled through the matching network circuit 110 to the first device 51 (e.g. the amplifier AMP1, or the differential amplifier DF_AMP).

According to some embodiments, no switch is needed in between the second device 52 (e.g. the amplifier AMP2, or the single-ended amplifier SE_AMP) and the first device 51 (e.g. the amplifier AMP1, or the differential amplifier DF_AMP), where the first device 51 and the second device 52 may operate independently. For example, the first device 51 and the second device 52 may operate independently while keeping similar input return loss. Please note that, in conventional dual paths matching, it is hard to implement shared matching network for both amplifiers but still keep the same matching impedance since the matching impedance would be variant during switching between turning on and turning off the amplifiers. Based on the architecture in any of the above embodiments of the present invention, the present invention circuit and apparatus (e.g. the matching network circuit 110 and the apparatus 100) can keep high stability of the electronic device in each of various situations, and the related art problems will no longer be an issue.

Figure 4:
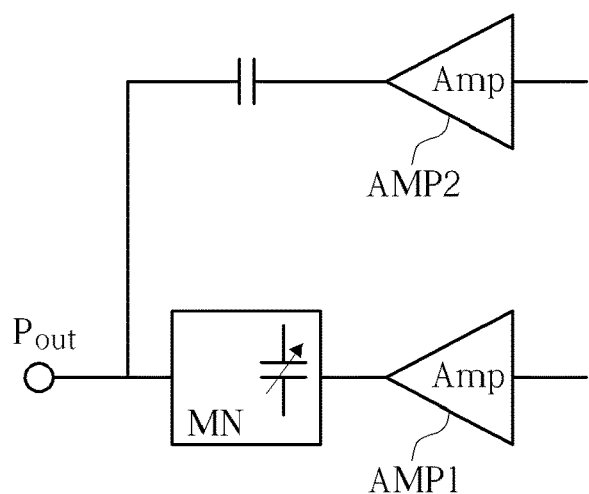
FIG. 4 illustrates some implementation details of the apparatus shown in FIG. 1 according to another embodiment of the present invention.

FIG. 4 illustrates some implementation details of the apparatus 100 shown in FIG. 1 according to another embodiment of the present invention, where the output port $P_{out}$ can be taken as an example of the output port Pout mentioned above. For example, the first device 51 and the second device 52 can be implemented with two amplifiers AMP1 and AMP2 (each of which is labeled "Amp" in FIG. 4, for brevity), respectively, and the two amplifiers AMP1 and AMP2 can be power amplifiers positioned in a transmitter such as that mentioned above, and can be single-ended amplifiers. In addition, the matching network (MN) can be taken as an example of the matching unit 111 shown in FIG. 1, and may comprise the aforementioned capacitor bank that may be tunable. Additionally, the capacitor electrically connected between the output port $P_{out}$ and the amplifier AMP2 can be taken as an example of the aforementioned passive component within the impedance unit 112. Based on the architecture shown in FIG. 4, the first path port P1 of this embodiment comprises a single input terminal electrically connected to the output terminal of the amplifier AMP1, and the second path port P2 of this embodiment comprises a single input terminal electrically connected to the output terminal of the amplifier AMP2. For brevity, similar descriptions for this embodiment are not repeated in detail here.

In the embodiment shown in FIG. 4, the capacitor electrically connected between the output port $P_{out}$ and the amplifier AMP2 can be taken as an example of the aforementioned passive component within the impedance unit 112. This is for illustrative purposes only, and is not meant to be a limitation of the present invention. According to some embodiments of the present invention, the passive component may vary. For example, this capacitor may be replaced by an inductor. In another example, this capacitor may be replaced by a high-impedance device.

Figure 5:
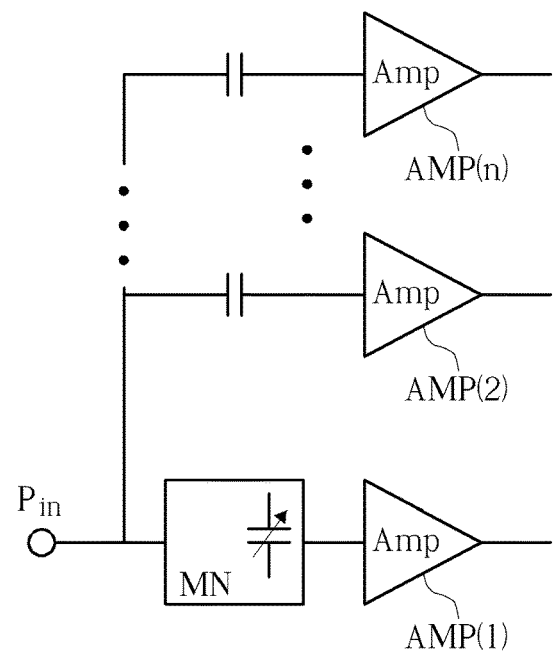
FIG. 5 illustrates some implementation details of the apparatus shown in FIG. 1 according to another embodiment of the present invention.

FIG. 5 illustrates some implementation details of the apparatus 100 shown in FIG. 1 according to another embodiment of the present invention, where the input port $P_{in}$ can be taken as an example of the input port Pin mentioned above. For example, the first device 51 can be implemented with the amplifier AMP(1) (labeled "Amp" in FIG. 5, for brevity) such as the amplifier AMP1 shown in FIG. 2, and the second device 52 can be implemented with one of the amplifiers AMP(2), . . . , and AMP(n) (labeled "Amp" in FIG. 5, for brevity), such as the amplifier AMP2 shown in FIG. 2. Thus, the second device 52 may be extended to a set of second devices. In the architecture shown in FIG. 5, the amplifiers AMP(1), AMP(2), . . . , and AMP(n) can be power amplifiers positioned in a transmitter such as that mentioned above, and can be single-ended amplifiers. This is for illustrative purposes only, and is not meant to be a limitation of the present invention. According to some embodiments, the amplifier AMP(1) may be replaced by a differential amplifier such as the differential amplifier DF_AMP shown in FIG. 3. According to some embodiments, in a situation where the input and output directions of each of the amplifiers AMP(1), AMP(2), . . . , and AMP(n) shown in FIG. 5 are reversed, the amplifiers AMP(1), AMP(2), . . . , and AMP(n) of these embodiments can be LNAs positioned in a receiver such as that mentioned above, and can be single-ended amplifiers. According to some embodiments, in a situation where the input and output directions of each of the amplifiers AMP(1), AMP(2), . . . , and AMP(n) shown in FIG. 5 are reversed, the amplifiers AMP(1), AMP(2), . . . , and AMP(n) of these embodiments can be LNAs positioned in a receiver such as that mentioned above, where the amplifier AMP(1) may be replaced by a differential amplifier such as the differential amplifier DF_AMP shown in FIG. 3, and the other amplifiers within the amplifiers AMP(1), AMP(2), . . . , and AMP(n) of these embodiments can be single-ended amplifiers.

In addition, the matching network (MN) can be taken as an example of the matching unit 111 shown in FIG. 1, and may comprise the aforementioned capacitor bank that may be tunable. Additionally, the capacitor electrically connected between the input port $P_{in}$ and one of the amplifiers AMP(2), . . . , and AMP(n) can be taken as an example of the aforementioned passive component within the impedance unit 112. Based on the architecture shown in FIG. 5, the first path port P1 of this embodiment comprises a single output terminal electrically connected to the input terminal of the amplifier AMP(1), and the second path port P2 of this embodiment has been extended to be a set of second path ports {P2}, each of which comprises a single output terminal electrically connected to the input terminal of one of the amplifiers AMP(2), . . . , and AMP(n). For brevity, similar descriptions for this embodiment are not repeated in detail here.

In the embodiment shown in FIG. 5, the capacitor electrically connected between the input port $P_{in}$ and one of the amplifiers AMP(2), . . . , and AMP(n) can be taken as an example of the aforementioned passive component within the impedance unit 112. This is for illustrative purposes only, and is not meant to be a limitation of the present invention. According to some embodiments of the present invention, the passive component may vary. For example, this capacitor may be replaced by an inductor. In another example, this capacitor may be replaced by a high-impedance device.

Figure 6:
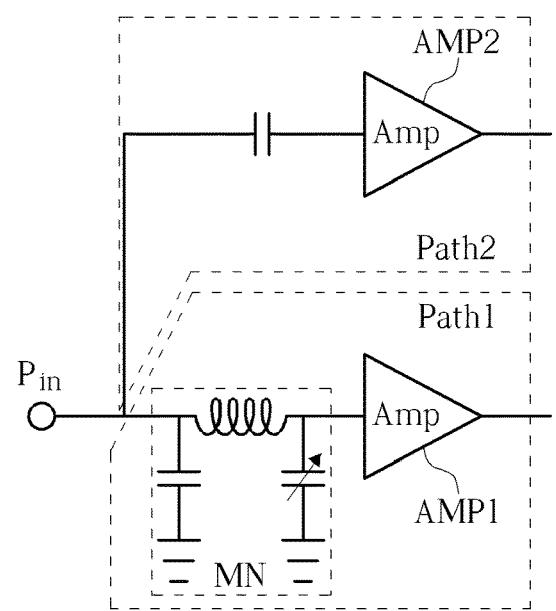
FIG. 6 illustrates some implementation details of the apparatus shown in FIG. 1 according to another embodiment of the present invention.

FIG. 6 illustrates some implementation details of the apparatus 100 shown in FIG. 1 according to another embodiment of the present invention, where the signal path Path1 can be taken as an example of the first path, and the signal path Path2 can be taken as an example of the second path. In comparison with the embodiment shown in FIG. 2, the architecture of the matching network (MN) may become more complicated when needed. In addition to the aforementioned capacitor bank that may be tunable, the matching network (MN) of this embodiment may further comprise an additional capacitor and an inductor coupled between the capacitor bank and the additional capacitor. For brevity, similar descriptions for this embodiment are not repeated in detail here.

Figure 7:
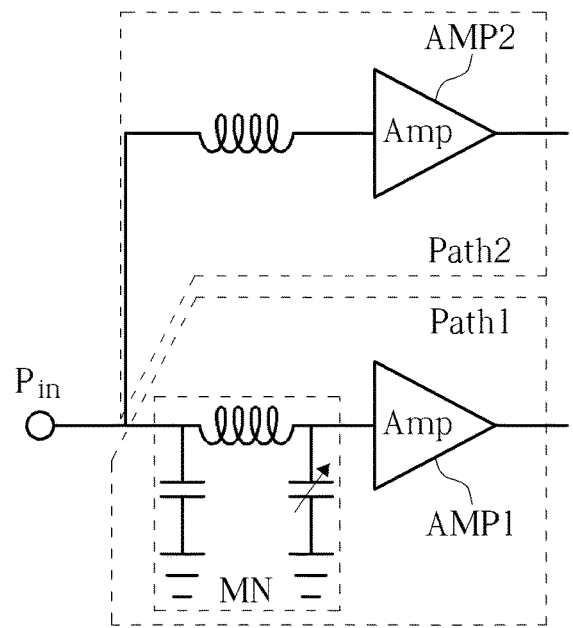
FIG. 7 illustrates some implementation details of the apparatus shown in FIG. 1 according to another embodiment of the present invention.

FIG. 7 illustrates some implementation details of the apparatus 100 shown in FIG. 1 according to another embodiment of the present invention, where the signal path Path1 can be taken as an example of the first path, and the signal path Path2 can be taken as an example of the second path. In comparison with the embodiment shown in FIG. 6, the capacitor electrically connected between the input port $P_{in}$ and the amplifier AMP2 has been replaced by an inductor. For brevity, similar descriptions for this embodiment are not repeated in detail here.

Figure 8:
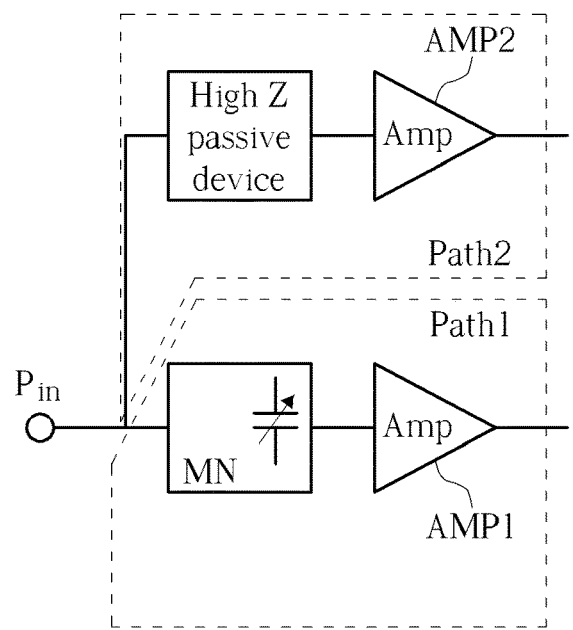
FIG. 8 illustrates some implementation details of the apparatus shown in FIG. 1 according to another embodiment of the present invention.

FIG. 8 illustrates some implementation details of the apparatus 100 shown in FIG. 1 according to another embodiment of the present invention, where the signal path Path1 can be taken as an example of the first path, and the signal path Path2 can be taken as an example of the second path. In comparison with the embodiment shown in FIG. 2, the capacitor electrically connected between the input port $P_{in}$ and the amplifier AMP2 has been replaced by a high-impedance device (labeled "High Z passive device" in FIG. 8, for better comprehension). For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A matching network circuit, comprising:
   a matching unit, coupled between a common path port and a first path port of the matching network circuit, arranged for performing impedance matching between the common path port and the first path port, wherein the common path port is utilized for connecting the matching network circuit to a common path, and the first path port is utilized for connecting the matching network circuit to a first device on a first path; and
   an impedance unit, coupled between the common path port and a second path port of the matching network circuit, arranged for performing impedance matching between the common path port and the second path port with aid of the matching unit, wherein the second path port is utilized for connecting the matching network circuit to a second device on a second path, and signals on the first and the second paths have a same transmission direction with respect to a node between the common path and the first and the second paths;
   wherein the matching network circuit receives an input signal and is coupled to an input terminal of the first device and an input terminal of the second device; and the matching network circuit filters the input signal to generate a first intermediate signal on the first path and to generate a second intermediate signal on the second path, wherein the input terminal of the first device inputs the first intermediate signal into the first device, and the input terminal of the second device inputs the second intermediate signal into the second device.

2. The matching network circuit of claim 1, wherein an impedance of the impedance unit is higher than that of the matching unit so that the matching unit dominates an overall impedance of the matching network circuit.

3. The matching network circuit of claim 1, wherein the matching unit comprises:
   a capacitor bank.

4. The matching network circuit of claim 3, wherein the capacitor bank is tunable.

5. The matching network circuit of claim 4, wherein the capacitor bank is used for fine tuning an overall impedance of the matching network circuit.

6. The matching network circuit of claim 1, wherein the impedance unit comprises:
   a passive component.

7. The matching network circuit of claim 1, wherein there is not any switch between the common path port and the impedance unit, and there is not any switch between the second path port and the impedance unit, wherein there is not any switch between the second path port and the second device.

8. The matching network circuit of claim 1, wherein there is not any switch between the common path port and the matching unit, and there is not any switch between the first path port and the matching unit, wherein there is not any switch between the first path port and the first device.

9. A matching network circuit, comprising:
   a matching unit, coupled between a common path port and a first path port of the matching network circuit, arranged for performing impedance matching between the common path port and the first path port, wherein the common path port is utilized for connecting the matching network circuit to a common path, and the first path port is utilized for connecting the matching network circuit to a first device on a first path; and
   an impedance unit, coupled between the common path port and a second path port of the matching network circuit, arranged for performing impedance matching between the common path port and the second path port with aid of the matching unit, wherein the second path port is utilized for connecting the matching network circuit to a second device on a second path, and signals on the first and the second paths have a same transmission direction with respect to a node between the common path and the first and the second paths;

wherein the matching network circuit outputs an output signal and is coupled to an output terminal of the first device and an output terminal of the second device; and the matching network circuit filters a first intermediate signal on the first path and a second intermediate signal on the second path to generate the output signal, wherein the output terminal of the first device outputs the first intermediate signal from the first device, and the output terminal of the second device outputs the second intermediate signal from the second device.

10. The matching network circuit of claim 9, wherein an impedance of the impedance unit is higher than that of the matching unit so that the matching unit dominates an overall impedance of the matching network circuit.

11. An apparatus, comprising:
a first device on a first path;
a second device on a second path; and
a matching network circuit, coupled between the first device and the second device, the matching network circuit comprising:
  a matching unit, coupled between a common path port and a first path port of the matching network circuit, arranged for performing impedance matching between the common path port and the first path port, wherein the common path port is utilized for connecting the matching network circuit to a common path, and the first path port is utilized for connecting the matching network circuit to the first device on the first path; and
  an impedance unit, coupled between the common path port and a second path port of the matching network circuit, arranged for performing impedance matching between the common path port and the second path port with aid of the matching unit, wherein the second path port is utilized for connecting the matching network circuit to the second device on the second path, and signals on the first and the second paths have a same transmission direction with respect to a node between the common path and the first and the second paths;
wherein the first device and the second device share the matching network circuit; the matching network circuit receives an input signal and is coupled to an input terminal of the first device and an input terminal of the second device; and the matching network circuit filters the input signal to generate a first intermediate signal on the first path and to generate a second intermediate signal on the second path, wherein the input terminal of the first device inputs the first intermediate signal into the first device, and the input terminal of the second device inputs the second intermediate signal into the second device.

12. The apparatus of claim 11, wherein an impedance of the impedance unit is higher than that of the matching unit so that the matching unit dominates an overall impedance of the matching network circuit.

13. The apparatus of claim 11, wherein the matching unit comprises:
a capacitor bank.

14. The apparatus of claim 13, wherein the capacitor bank is tunable.

15. The apparatus of claim 14, wherein the capacitor bank is used for fine tuning an overall impedance of the matching network circuit.

16. The apparatus of claim 11, wherein the impedance unit comprises:
a passive component.

17. An apparatus, comprising:
a first device on a first path;
a second device on a second path; and
a matching network circuit, coupled between the first device and the second device, the matching network circuit comprising:
  a matching unit, coupled between a common path port and a first path port of the matching network circuit, arranged for performing impedance matching between the common path port and the first path port, wherein the common path port is utilized for connecting the matching network circuit to a common path, and the first path port is utilized for connecting the matching network circuit to the first device on the first path; and
  an impedance unit, coupled between the common path port and a second path port of the matching network circuit, arranged for performing impedance matching between the common path port and the second path port with aid of the matching unit, wherein the second path port is utilized for connecting the matching network circuit to the second device on the second path, and signals on the first and the second paths have a same transmission direction with respect to a node between the common path and the first and the second paths;
wherein the first device and the second device share the matching network circuit; the matching network circuit outputs an output signal and is coupled to an output terminal of the first device and an output terminal of the second device; and the matching network circuit filters a first intermediate signal on the first path and a second intermediate signal on the second path to generate the output signal, wherein the output terminal of the first device outputs the first intermediate signal from the first device, and the output terminal of the second device outputs the second intermediate signal from the second device.

18. The apparatus of claim 17, wherein an impedance of the impedance unit is higher than that of the matching unit so that the matching unit dominates an overall impedance of the matching network circuit.

* * * * *